United States Patent
Naoi et al.

(10) Patent No.: US 7,375,771 B2
(45) Date of Patent: May 20, 2008

(54) RECEIVER HAVING A FUNCTION TO TUNE AND SET A CHANNEL AND CHANNEL SETUP METHOD

(75) Inventors: Nobuaki Naoi, Yokohama (JP); Fumio Miyazawa, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 1094 days.

(21) Appl. No.: 10/626,846

(22) Filed: Jul. 25, 2003

(65) Prior Publication Data

US 2004/0207764 A1 Oct. 21, 2004

(30) Foreign Application Priority Data

Apr. 16, 2003 (JP) ............................. 2003-110992

(51) Int. Cl.
*H04N 5/50* (2006.01)
(52) U.S. Cl. ...................................... 348/732; 348/731
(58) Field of Classification Search ................ 348/725, 348/728, 731–733; 455/182.3, 192.2, 192.3; H04N 5/50, H04N 5/44
See application file for complete search history.

(56) References Cited

U.S. PATENT DOCUMENTS

| 4,737,993 A | * | 4/1988 | DeVilbiss | .................. 348/731 |
| 4,763,195 A | * | 8/1988 | Tults | .......................... 348/732 |
| 4,776,038 A | * | 10/1988 | Testin et al. | ................. 348/732 |

FOREIGN PATENT DOCUMENTS

| GB | 2 345 598 | 7/2000 |
| GB | 2 375 245 | 11/2002 |
| JP | 2000-59180 | 2/2000 |
| JP | 2002-218335 | 8/2002 |
| JP | 2002-247460 | 8/2002 |
| JP | 2002-344829 | 11/2002 |

* cited by examiner

*Primary Examiner*—Sherrie Hsia
(74) *Attorney, Agent, or Firm*—McDermott Will & Emery LLP

(57) ABSTRACT

When channel setup is carried out under poor receiving condition, the previous channel information that has been stored on a channel map in the channel setup carried out under normal receiving condition is replaced with the later channel information that is stored on the channel map including less acquired channel information formed in the channel setup carried out later. Existence of broadcast signal is judged only on channels other than channels that are registered based on the fact that the channels include a broadcast signal on a channel map stored in the previous channel setup, and the channel information of the broadcast signal detected later is registered additionally on the channel map in a flash memory as the channel including the broadcast signal.

18 Claims, 7 Drawing Sheets

FIG. 3

| FLASH MEMORY 52 ADDRESS | PHYSICAL CHANNEL | MAJOR CHANNEL | MINOR CHANNEL | SCAN SETTING |
|---|---|---|---|---|
| 1 | 2 | 2 | 1 | ON |
| 2 | 2 | 2 | 2 | ON |
| 3 | 6 | 6 | 3 | ON |
| 4 | 6 | 6 | 4 | ON |
| 5 | 12 | 6 | 5 | ON |
| 6 | 14 | 6 | 6 | ON |
| 7 | 61 | 121 | 1 | ON |
| 8 | – | – | – | – |
| ⋮ | ⋮ | ⋮ | ⋮ | ⋮ |
| ZZ | – | – | – | – |

FIG. 4

| CHANNEL | SCAN |
|---|---|
| 2-1 | ON |
| 2-2 | ON |
| 6-3 | ON |
| 6-4 | ON |
| 6-5 | ON |
| 6-6 | ON |
| 121-1 | ON |

FIG. 5

| FLASH MEMORY 52 ADDRESS | PHYSICAL CHANNEL | MAJOR CHANNEL | MINOR CHANNEL | SCAN SETTING |
|---|---|---|---|---|
| 1 | 2 | 2 | 1 | ON |
| 2 | 2 | 2 | 2 | ON |
| 3 | 3 | – | – | OFF |
| 4 | 4 | – | – | OFF |
| 5 | 5 | – | – | OFF |
| 6 | 6 | 6 | 3 | ON |
| 7 | 6 | 6 | 4 | ON |
| 8 | 7 | – | – | OFF |
| 9 | 8 | – | – | OFF |
| 10 | 9 | – | – | OFF |
| 11 | 10 | – | – | OFF |
| 12 | 11 | – | – | OFF |
| 13 | 12 | 6 | 5 | ON |
| 14 | 13 | – | – | OFF |
| 15 | 14 | 6 | 6 | ON |
| 16 | 15 | – | – | OFF |
| ⋮ | ⋮ | ⋮ | ⋮ | ⋮ |
| XX | 61 | 121 | 1 | ON |
| XY | 62 | – | – | OFF |
| ⋮ | ⋮ | ⋮ | ⋮ | ⋮ |
| ZZ | 69 | – | – | OFF |

FIG. 8

| FLASH MEMORY 52 ADDRESS | PHYSICAL CHANNEL | MAJOR CHANNEL | MINOR CHANNEL | SCAN SETTING | NUMBER OF NON-RECEPTION T |
|---|---|---|---|---|---|
| 1 | 2 | 2 | 1 | ON | 5 |
| 2 | 2 | 2 | 2 | ON | 5 |
| 3 | 6 | 6 | 3 | ON | 0 |
| 4 | 6 | 6 | 4 | ON | 0 |
| 5 | 12 | 6 | 5 | ON | 0 |
| 6 | 14 | 6 | 6 | ON | 0 |
| 7 | 61 | 121 | 1 | ON | 0 |
| 8 | – | – | – | – | – |
| ⋮ | ⋮ | ⋮ | ⋮ | ⋮ | |
| ZZ | – | – | – | – | – |

RECEIVER HAVING A FUNCTION TO TUNE AND SET A CHANNEL AND CHANNEL SETUP METHOD

BACKGROUND OF THE INVENTION

An analogue broadcast television receiver or a digital broadcast television receiver stores receivable channel information as channel map data in, for example, a non-volatile memory. A desired channel is tuned from among stored receivable channels by up/down tuning of channels. However, the receivable channel information is not included in the channel map data when a power source is supplied to the television receiver at the first set-up. To include the receivable channel information in the channel map data at a first channel setup operation is carried out in which each channel is tuned repeatedly over the predetermined frequency band range assigned as the television broadcast frequency band from the minimum frequency channel to the maximum frequency channel to store the channel information of the receivable channels in a non-volatile memory as the channel map data, and then the stored channel map is used for, for example, up/down tuning of a channel. Such conventional prior art is disclosed in, for example, Japanese Patent Laid-Open No. 2002-247460, Japanese Patent Laid-Open No. 2000-59180, Japanese Patent Laid-Open No. 2002-218335, and Japanese Patent Laid-Open No. 2002-344829.

SUMMARY OF THE INVENTION

This invention relates to a receiver having a function to tune and set a channel.

A user cannot register a desired channel in a channel map if the reception level $\chi$ of the channel happens to be lower than the reception limit occasionally due to fluctuation during channel setup operation. The user, who is aware of the above-mentioned situation, carries out channel initial operation again by, for example, changing the angle or direction of an antenna so as to register the desired channel in the channel map. At that time, waiting time of 68 channels×2 seconds=136 seconds is required to scan all the 68 channels of US Air broadcast on the assumption that channel setup operation requires up to 2 seconds for each channel, and the user must wait for 136 seconds additionally until the channel setup operation is completed. In the operation, the former data is erased and then new data is overwritten on the channel map in the non-volatile memory.

The above-mentioned trouble is apt to occur when a portable antenna, namely an indoor simple antenna, is used. Particularly, a portable antenna is used more popularly for digital broadcast in which S/N scarcely affects the image with low ghost and electric field than for analogue broadcast. In this case, because the reception level is unstable due to radio wave fluctuation depending on the location and surrounding obstraction of the portable antenna and meteorological condition, the user can get desired channels only partially at the first channel setup, even though desired channels are being broadcasted. The user is required to carry out channel setup repeatedly many times to get all the desired channels.

The same is true for the portable liquid crystal television receiver provided with a small liquid crystal display panel of, for example, five inches and a small antenna.

Directing of an antenna in the outdoor space correctly to a broadcasting station of the desired channel brings about suppression of radio wave reception fluctuation, however, a radio wave with small electric field intensity broadcasted from a broadcasting station is received unstably depending on the meteorological condition.

The channel map is overwritten and the former channel map is erased when channel setup is carried out again in the midnight when some channels are not being broadcasted, and a new channel map without some channels that are not being broadcasted is formed.

In the case of analogue broadcast, the broadcast reception frequency to be received corresponds one-to-one to the channel, and as a matter of course it is possible to tune a desired channel directly by using a numeric key. On the other hand, in the case of digital broadcast, for example, ATSC of USA employs X-Y type representation as the channel representation (referred to as logical channel hereinafter) of the broadcast program wherein X denotes the number of major channels and Y denotes the number of minor channels. Hence, a broadcast wave of one reception frequency includes a plurality of multiplexed broadcast programs, and the logical channel X-Y of each broadcast program among the plurality of broadcast programs is different from each others. As described hereinabove, the logical channel number does not correspond one-to-one to the reception frequency. It is difficult to receive a desired broadcast program directly based on a logical channel number that indicates the broadcast program. To receive a desired broadcast program, it is required to form a channel map, namely corresponding table that lists the received reception frequency and the logical channel number for tuning. The channel like as analogue channel in which the reception frequency corresponds one-to-one to the channel number is referred as physical channel hereinafter for differentiation from the logical channel.

As described hereinabove, the prior art requires repeated channel setup operation over all the channels to surely register broadcast wave near the limit reception level, and the operation requires a long time. This is a problem of the prior art.

The present invention has been accomplished in view of the above-mentioned problem, and it is an object of the present invention to provide a television receiver that is advantageous in that the time required for second and subsequent channel setup is short conveniently.

To solve the above-mentioned problem, the present invention provides a television receiver in which channels having broadcast signals the existence of which has already been stored are skippingly scanned in following channel setup and only channels having new channel information are stored additionally during the channel setup for setting up channels to be tuned by way of channel up/down tuning.

According to the present invention, a channel map is not overwritten in a memory, and only channel information that has not been detected before is registered additionally on the channel map in the memory, and as the result the time required for second and subsequent channel setup is shortened.

Furthermore, because channel setup can be carried out repeatedly without overwriting, the adverse influence of reception level fluctuation of the broadcast signal is mitigated and desired channels that have not been set up can be registered on the channel map more surely.

BRIEF DESCRIPTION OF THE DRAWING

These and other features, objects and advantages of the present invention will become more apparent from the following description when taken in conjunction with the accompanying drawings wherein:

FIG. 3 is an exemplary conceptual diagram of a channel map;

FIG. 4 is an exemplary display of the channel map shown in FIG. 3;

FIG. 5 is another exemplary display of the conceptual diagram of the channel map;

FIG. 8 is an exemplary conceptual diagram of another channel map.

DETAILED DESCRIPTION OF THE PREFERRED EMBODIMENTS

Figure 1:
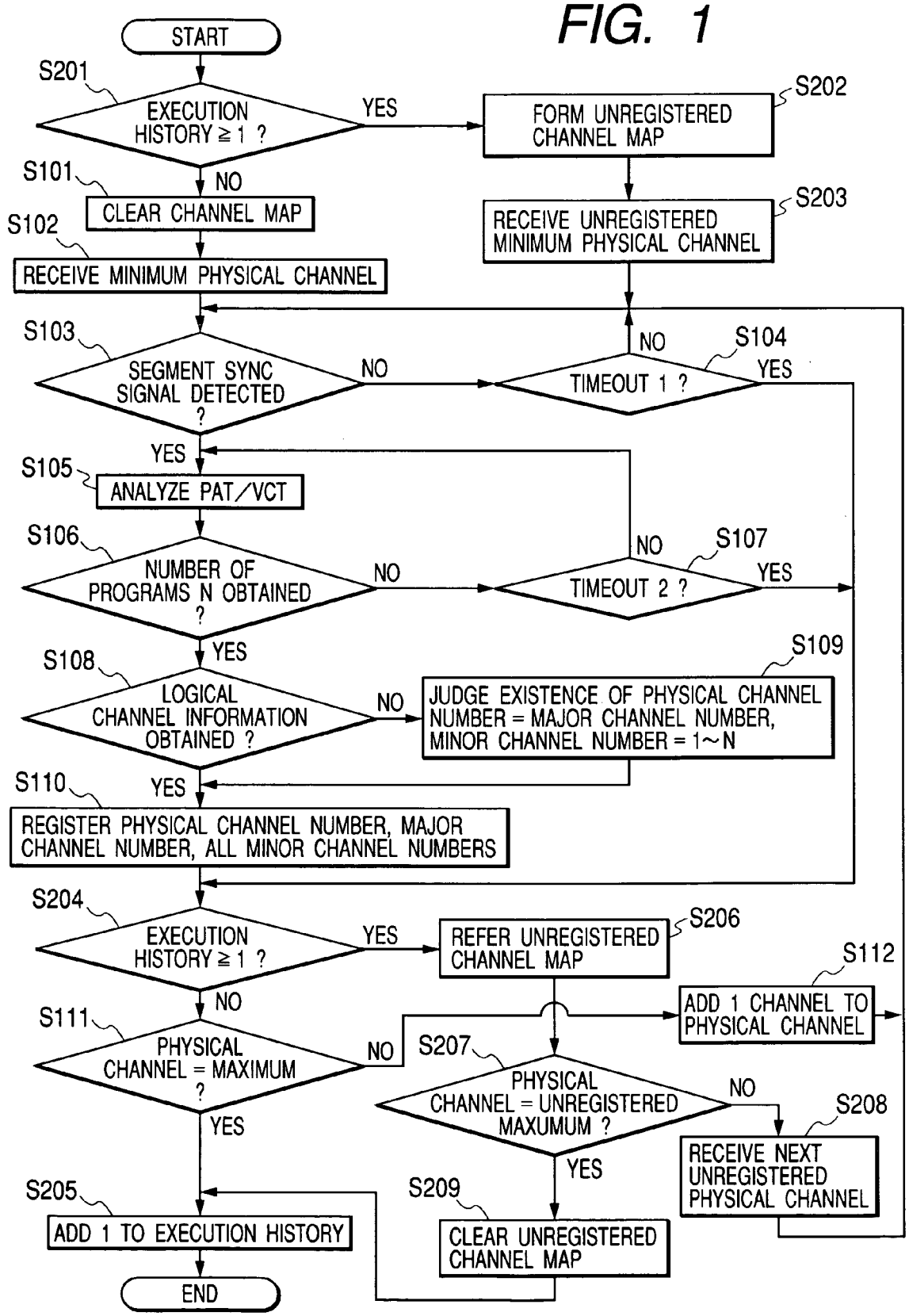
FIG. 1 is a flow chart describing channel setup operation of an ATSC terrestrial broadcast receiver in accordance with an embodiment of the present invention.

While we have shown and described several embodiments in accordance with our invention, it should be understood that disclosed embodiments are susceptible of changes and modification without departing from the scope of the invention. Therefore, we do not intend to be bound by the details shown and described herein but intend to cover all such changes and modifications a fall within the ambit of the appended claims.

Embodiments of the present invention will be described hereinafter with reference to the drawings. At first, the outline of the terrestrial digital broadcast is described referring to USA ATSC terrestrial broadcast.

ATSC (Advanced Television Systems Committee of USA) terrestrial broadcast involves, differently from analogue broadcasting, broadcasting in which image and audio of a plurality of broadcast programs are compressed separately by MPEG-2 encoder and converted to packets together with broadcast program information data (program specific information, abbreviated to PSI hereinafter), namely transport stream (abbreviated to TS hereinafter), and modulated to digital data for broadcasting.

Analogue broadcast involves only physical channels. On the other hand, ATSC terrestrial broadcast involves logical channels that correspond one-to-one to physical channels. The logical channel given with Major channel and Minor channel that are multiplexed in one physical channel, and each logical channel provides different broadcast programs for broadcasting.

A Major channel number and a Minor channel number are assigned arbitrarily by broadcasting station side, and these numbers included in PSI data are broadcasted. Therefore, it is required to analyze the PSI data at first to recognize the Major channel number and Minor channel number and to recognize other necessary data.

Hence, in the channel setup operation of an ATSC terrestrial broadcast receiver, the PSI data is analyzed to register a Major channel number and a Minor channel number on a channel map. As described hereinbefore, ATSC terrestrial broadcast of USA involves broadcasting in which image and audio of a plurality of broadcast programs are compressed separately by MPEG-2 encoder and converted to packets together with PSI data for time division broadcasting. An arbitrary number, namely packet identifier (abbreviated to PID hereinafter), is assigned to each packet according to the standard, but a number is assigned to some packets. For example, according to MPEG-2 standard (ISO/IEC 13818-1), PID 0x0000 is assigned to a program association table (abbreviated to PAT hereinafter) that includes information of whole TS. According to ATSC standard, PID 0x1FFB is assigned to a virtual channel table (abbreviated to VCT hereinafter).

PAT includes a program number that indicates the number of broadcast programs included in one physical channel (namely, total channel number of the logical channel), and the number of broadcast programs included in a received physical channel is found by analyzing the PAT. VCT includes Major channel number and Minor channel number of all the programs included in a received physical channel, and the logical channel number information is found by analyzing the VCT. The details are described in Table 4.2 of USA ATSC Standard A/65.

The whole packet that is broadcasted in time division is called as TS, and TS is modulated digitally by use of an 8-VSB (Vestigial Sideband Modulation) modulator and then UP-converted to a predetermined frequency for broadcasting as RF signal.

Figure 6:
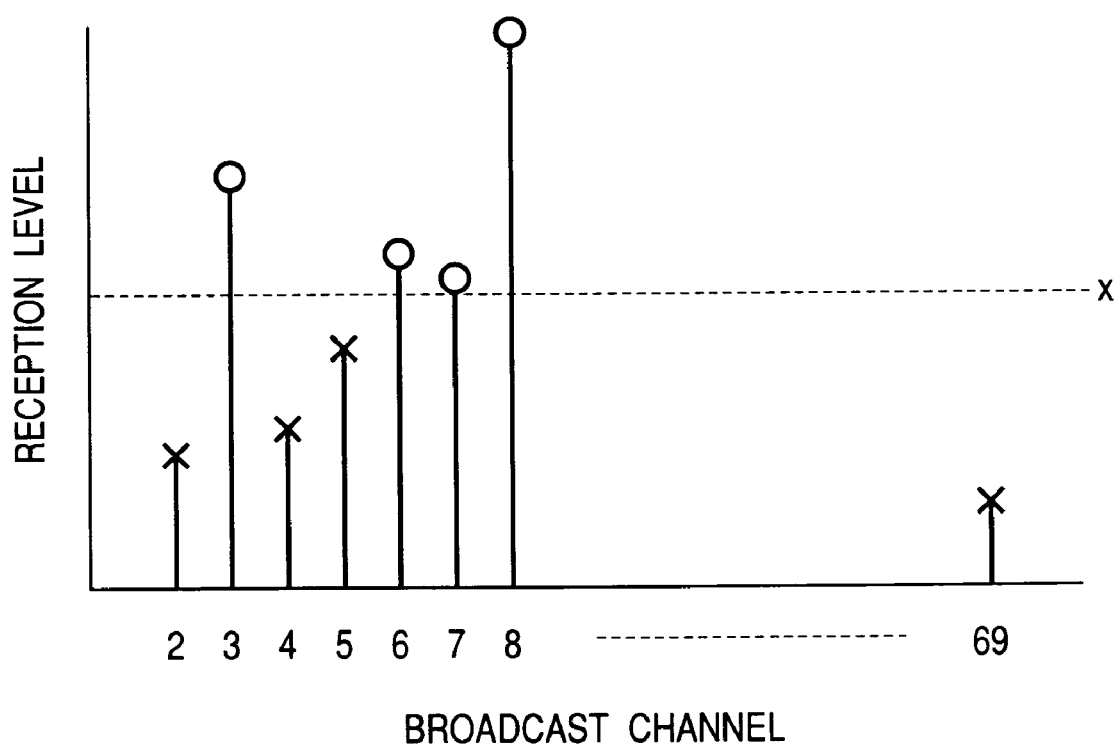
FIG. 6 is an exemplary reception level of a broadcast channel.

FIG. 6 shows an exemplary reception level of a broadcast channel. In FIG. 6, a vertical bar shows a reception level of each frequency band for each broadcast channel, and $\chi$ indicates reception limit level on which a horizontal sync signal of an image signal included in a broadcast wave of analogue broadcast is detectable and the broadcast wave is judged to be receivable. In the case of terrestrial digital television broadcast according to digital broadcast system, $\chi$ indicates reception limit level on which a segment sync signal showing reception of effective digital broadcast is detectable. ○ shows that a channel is judged to be being received as a broadcast wave and X shows that a channel is judged to be being not received as a broadcast wave. Channels with ○ in FIG. 6 are judged to be being broadcasted and these channels are set so as not to be skipped in channel up/down tuning. Because channel 7 has scarce allowance to the limit reception level, the broadcast wave reception fluctuates depending on flying of an aircraft, meteorological condition, or antenna angle/direction change due to wind. If the reception level falls down exceeding the limit reception level $\chi$ due to fluctuation, channel setup is carried out so as to skip this channel at that time.

Figure 2:
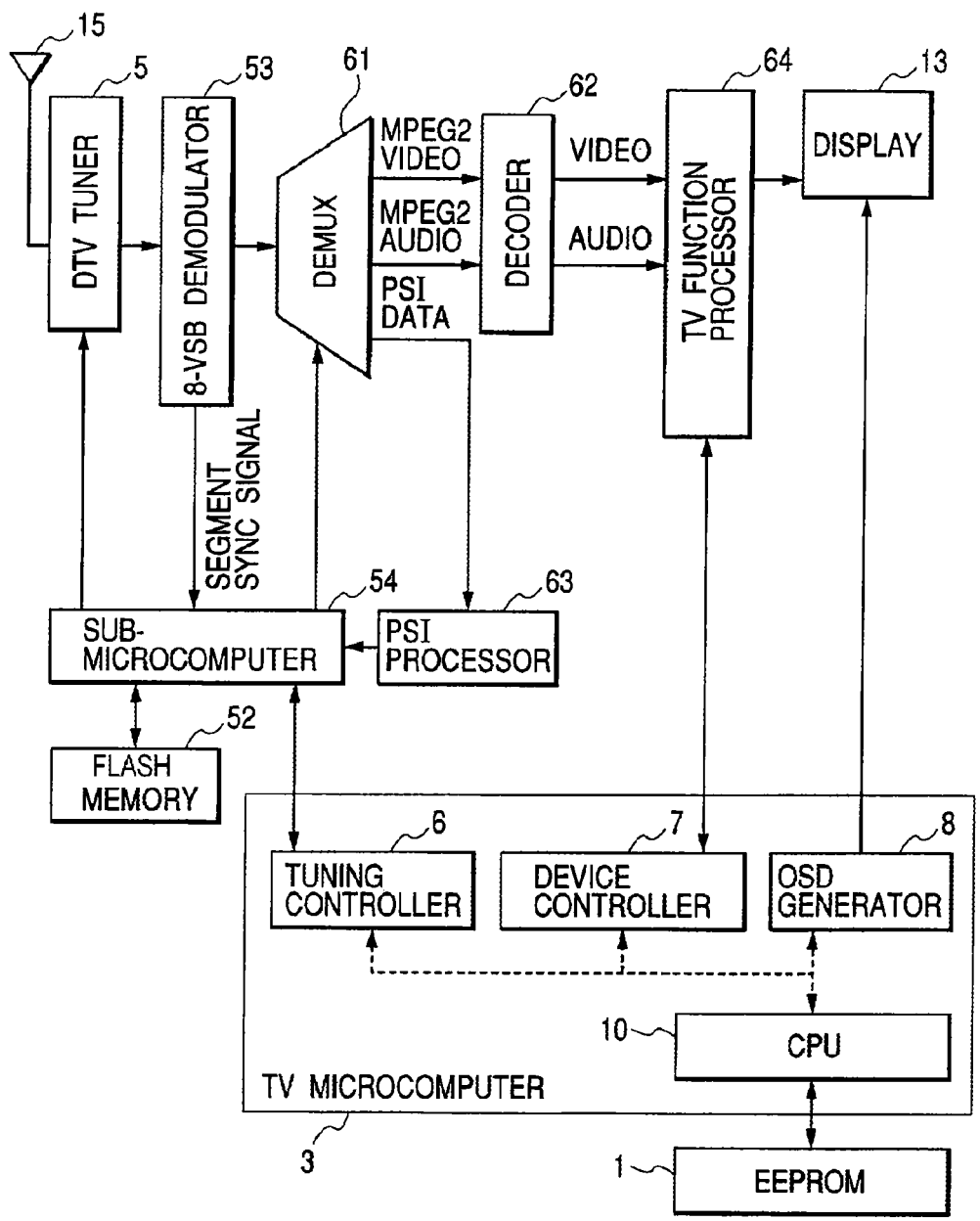
FIG. 2 is a block diagram showing a conceptual structure of the ATSC terrestrial broadcast receiver.

FIG. 2 is a block diagram showing the schematic structure of an ATSC terrestrial broadcast television receiver that is an embodiment of the present invention. In FIG. 2, antenna 15 receives ATSC terrestrial broadcast and it is supplied to a DTV tuner 5. An 8-VSB demodulator 53 demodulates the broadcast to a TS signal and a demultiplexer DEMUX 61 separates the demodulated broadcast into MPEG-2 video, MPEG-2 audio, and PSI data.

A decoder 62 decodes the MPEG-2 video and MPEG-2 audio into a video signal and an audio signal, and a TV function processor 64 processes it and supplies to a display 13. A PSI processor 63 analyzes the PSI data and supplies the resultant data to a digital tuner controlling sub-microprocessor (abbreviated to sub-microcomputer hereinafter) 54.

A TV function controlling microprocessor (abbreviated to TV microcomputer hereinafter) 3 comprises a tuning controller 6 for tuning and controlling a digital tuner through the sub-microcomputer 54, a device controller 7 for controlling the TV function processor 64, an OSD generator 8 for supplying an OSD (On Screen Display) signal to the display 13 to display the OSD of the video signal, and a CPU 10 that is an arithmetic controlling means for controlling the above-mentioned components, namely tuning controller 6, device controller 7, and OSD generator 8.

The CPU 10 of the TV microcomputer 3 controls the sub-microcomputer 54 through the tuning controller 6, controls the TV function processor 64 through the device controller 7, and controls the OSD generator 8 to supply an OSD signal to the display 13. As the result, TV function setting information is stored in an EEPROM 1, which is a nonvolatile memory. An execution history value showing the number of repeated execution of channel setup operation, which will be described hereinafter, is stored in the memory of the EEPROM 1.

The tuning controller 6 of the TV microcomputer 3 control the sub-microcomputer 54, and the sub-microcomputer 54 controls the DTV tuner 5 for tuning to obtain the detected information of the segment sync signal specified according to ATSC from the 8-VSB demodulator 53. Furthermore, the sub-microcomputer 54 controls the DEMUX 61 to extract image data and audio data of a desired broadcast program, and as required, stores tuning setting information supplied from the PSI processor 63 in a flash memory 52 and controls the flash memory 52 to read out the tuning setting information.

FIG. 1 is a flow chart showing channel setup operation for an ATSC terrestrial broadcast receiver in accordance with an embodiment of the present invention. The flow chart shown in FIG. 1 is described in detail with reference to the block diagram shown in FIG. 2.

In FIG. 1, upon receiving channel setup indication (not shown in the drawing) from a user, the CPU 10 of the TV microcomputer 3 indicates channel setup to the sub-microcomputer 54 through the tuning controller 6 of the TV microcomputer 3. At that time, the execution history value stored in the EEPROM 1 for showing the number of execution of channel setup operation is also sent out. At first, the sub-microcomputer 54 checks the execution history value that shows the number of channel setup execution in S201. The sequence proceeds to S101 because the execution history value is 0 when the television receiver is subjected to the first channel setup operation.

The sub-microcomputer 54 clears the channel map data in the flash memory 52 in S101. Next, the DTV tuner 5 tunes the minimum physical channel in S102 and judges whether a segment sync signal specified according to ATSC, which arises from a broadcast signal, is detected or not based on the demodulation result of the 8-VSB demodulator 53 in S103. If the segment sync signal is not detected, the sequence proceeds to S104. Timeout 1 that involves whether a predetermined time T1 elapses or not is judged in S104, and if the timeout 1 is judged to be NO, the sequence returns to S103 to continue detection of segment sync signal. On the other hand, if the timeout 1 is judged to be YES, the sequence proceeds to S204.

If a segment sync signal is detected in S103, the sub-microcomputer 54 obtains PAT and VCT from the PSI processor 63 in S105 and analyzes them, and checks whether the multiplexed program number N can be obtained or not based on the analysis result of the PAT in S106. If the multiplexed program number N cannot be obtained, the timeout 2 that involves whether the predetermined time T2 elapses or not is judged in S107. If the NO judgment is obtained, the sequence returns to S105 to continue acquisition and analysis of PAT and VCT, on the other hand if YES judgment is obtained, the sequence proceeds to S204.

If program number N can be obtained in S106, the sub-microcomputer 54 judges whether the logical channel information is obtained or not based on the VCT analysis in S108. If YES result is obtained, the sequence proceeds to S110. If NO result is obtained, the physical channel number is assigned as Major channel number and Minor channel number is judged to be in a range from 1 to the program number N in S109, and the sequence proceeds to S110. In S110, the physical channel number, Major channel number, and Minor channel number obtained as described hereinabove are stored in the flash memory 52, and whether the execution history value is 1 or a number larger than 1 is judged in S204. Because the execution history value is 0 when the receiver is subjected to the first channel setup operation, whether the current physical channel is the maximum channel or not is judged in S111.

If the current channel is the maximum channel in S111, the sequence proceeds to S205. In S205, the sub-microcomputer 54 supplies end information of channel setup operation to the TV microcomputer 3, and upon receiving the end information the TV microcomputer 3 adds 1 to the execution history value stored in the EEPROM 1. The sequence proceeds to the end. If the current physical channel is not the maximum channel, the sequence proceeds to S112. In S112, the physical channel having the number that is larger by 1 than the number of the current physical channel is indicated to the DTV tuner 5 for tuning, and the sequence returns to S103.

If the channel setup operation is not first channel setup operation, the execution history value of 1 is obtained in S201. Therefore, the sequence proceeds to S202. In S202, the sub-microcomputer 54 refers a channel map stored in the flash memory 52 formed before to form a different unregistered channel map that is a channel map in which unregistered channels skipped in previous channel setup operation are listed, for example, in the ascending order, and the unregistered channel map is stored in the flash memory 52. In S203, an unregistered minimum physical channel is searched on the unregistered channel map. The sub-microcomputer receives the unregistered minimum physical channel, and the sequence proceeds to S103 for segment sync detection judgment. After that, the sequence proceeds to S204 through the same route.

Because the execution history value is 1 or larger if this channel setup operation is not the first channel setup operation, the judgment in S204 is YES this time and the sequence proceeds to S206. In S206, the sub-microcomputer 54 refers the unregistered channel map stored in the flash memory 52 to find out the unregistered maximum physical channel from among unregistered physical channels. In S207, whether the current physical channel is the unregistered maximum physical channel or not is checked. If NO result is obtained, the next higher order unregistered physical channel in the unregistered channel map is received in S208 and the sequence returns to S103. If YES result is obtained in S207, YES means that channel setup operation of the unregistered physical channels in the unregistered channel map has been completed. Therefore, the unregistered channel map is cleared in S209, 1 is added to the execution history value in S205, and the sequence proceeds to the end.

FIG. 3 is an exemplary conceptual diagram of a channel map formed in the flash memory 52 by executing the channel setup operation shown in FIG. 1 in the case of the ATSC terrestrial broadcast receiver shown in FIG. 2.

In the example shown in FIG. 3, physical channels 2, 6, 12, 14, and 61 are registered, and other physical channels are not registered. The CPU 10 of the TV microcomputer 3 controls the sub-microcomputer 54 through the tuning controller 6 to thereby control the OSD generator 8 with reference to the channel map data formed in the flush memory 52. As the result, Major channels, Minor channels, and scan ON/OFF setting value are displayed on the display 13 as a channel map. For example, a first address of the flash memory 52 is displayed as 2-1 ON.

FIG. 4 shows an exemplary display of the channel map shown in FIG. 3. In this example, Major channel 6 is used as the logical channel for physical channels 6, 12, and 14, and 6-3, 6-4, 6-5, and 6-6 are registered on the channel map.

When channel up/down tuning is carried out, the TV microcomputer 3 directs the sub-microcomputer 54 to tune the channel up/down by means of channel up/down tuning direction by use of a user interface such as remote controller command or switch operation though not shown in FIG. 2. The sub-microcomputer 54 controls the DTV tuner 5 through the tuning controller 6 to tune a logical channel of ON scan setting next to the current Major-Minor channel with reference to the channel map data stored in the flash memory 52. For example, when the channel is to be up during viewing 6-4 channel in the channel map shown in FIG. 3, the CPU of the TV microcomputer 3 directs the sub-microcomputer 54 to up the channel through the tuning controller 6. The sub-microcomputer 54 controls the DTV tuner 5 to tune the physical channel 12 with reference to the channel map data stored in the flash memory 52 so as to tune 6-5 channel that is listed at the next higher order to 6-4 channel.

FIG. 5 shows another exemplary conceptual channel map diagram different from that shown in FIG. 3. Only received channel information is stored in FIG. 3, but the channel information is stored for every physical channel in the flash memory 52. In FIG. 5, for example, the address 1 corresponds to the logical channel 2-1 broadcast program in the physical channel 2 and scan setting is ON so that this broadcast program is tuned in channel up/down tuning. The physical channel 3 of the address 3 corresponds to no broadcast program, and scan setting is OFF so that this broadcast program is skipped in channel up/down tuning.

As described hereinabove, according to the present invention, the channel setup operation is carried out over not all the physical channels in the second and following channel setup by use of the execution history value that shows the number of execution of channel setup, but the channel setup operation is carried out only over unregistered physical channels. As the result, the time required for channel setup is shortened by that much.

Furthermore, the channel map is not cleared (overwritten) and unregistered physical channel data is added in the second and following channel setup. As the result, channel setup can be carried out repeatedly and desired channels that have not been registered in the previous channel setup are registered surely on the channel map.

Furthermore, in application of the present invention to a television receiver having antenna direction/angle presetting function, for example, in application of the present invention to an antenna having two antenna setting modes A and B, the first channel setup is carried out in mode A and then next channel setup is carried out in mode B to register unregistered physical channels. As the result, broadcast signals coming form at least two directions can be registered surely on the channel map advantageously. As a matter of course, the present invention can be applied to the case in which antenna input is switched manually.

Channel setup operation is carried out in response to a direction from a user in the above, but the present invention is by no means limited to such channel setup operation. If the execution history value of channel setup operation is 1 or larger, the channel setup operation may be carried out automatically and periodically without channel setup operation direction from a user. Particularly, channel setup operation is carried out while the television receiver is being in standby mode (power saving mode in which AC power source is being supplied but the power source is turned off apparently), then the channel setup operation can be carried out without interruption of viewing advantageously. The cycle time of periodical channel setup operation is arbitrary, but once a day is preferable.

The above-mentioned modification can be realized easily with a small modification of the flow chart shown in FIG. 1, and the modified flow chart is not shown. According to the above-mentioned modification, broadcast programs that have not been registered on the channel map due to reception level fluctuation can be registered automatically, and troublesome channel setup operation direction is not required. As the result, channel setup operation is carried out smoothly. Furthermore, the modification is advantageous in that a physical channel that becomes available newly and a logical channel included in the physical channel are recognized and registered.

According to the present invention, the time required for the second and following channel setup operation is shortened in the channel setup operation of a television receiver for forming a channel map when channel up/down tuning is carried out.

The timeout time may be variable depending on the execution history judgment result of the channel setup operation without fixing the timeout condition in S104 and S107 differently from the above-mentioned description. For example, the timeout time is set longer for the second and following channel setup operation than for the first channel setup operation to thereby extend the segment sync detection time or PAT/VCT analysis time, and the detection miss is reduced. The flowchart for realizing this modification can also be realized easily by modifying the original flow chart, and the modified flow chart is not shown herein.

As a matter of course, a television receiver in accordance with the present invention functions to clear the channel map and initialize the execution history value so that the receiver can be used after moving house. For example, resetting of whole receiver is made unnecessary by proving an initialization button on the body that is used exclusively to initialize the channel map. For example, only the channel map and the execution history value are initialized keeping the user setting of image.

In the embodiment shown in FIG. 1, channels that have been once registered are not erased from the channel map even when subsequent channel setup operation is repeated. However, the channel can be changed for some reason of the broadcasting station side. In such situation, it is possible to rearrange the channel map automatically. In the rearrangement, the existence of broadcast signal in the currently registered channels is judged to store the number of judgment of continuous no broadcast signal as the number of no reception on the channel map, and the channel information is erased from the channel map to thereby erase automatically the channel information that becomes unreceivable when the number of no reception exceeds a predetermined number in the channel setup operation to show that broadcasting of the channel is stopped presumably.

Figure 7:
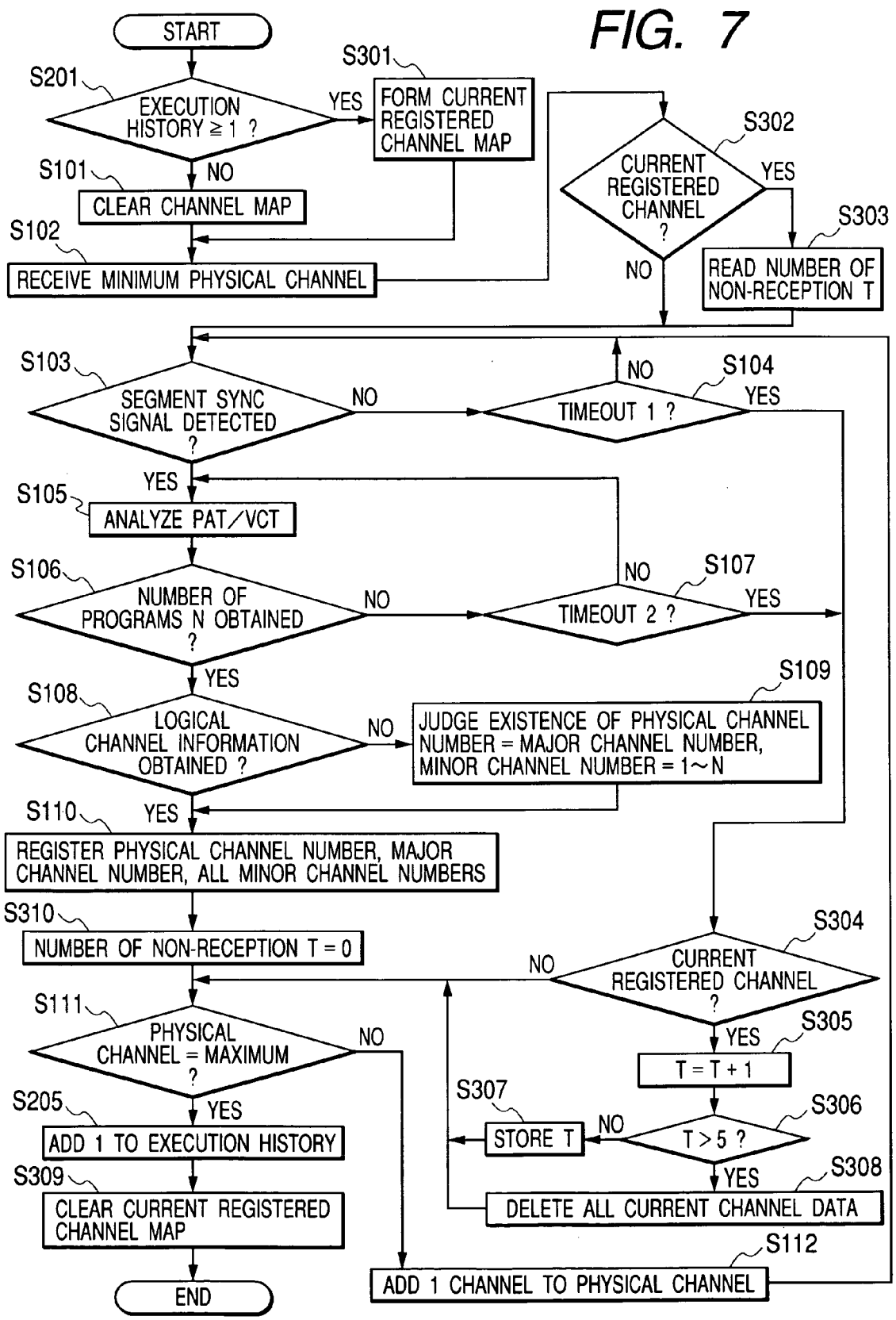
FIG. 7 is a flow chart describing channel setup operation of an ATSC terrestrial broadcast receiver in accordance with another embodiment of the present invention.

FIG. 7 is a flow chart describing the channel setup operation of an ATSC terrestrial broadcast receiver that can automatically erase the unreceivable channel information to automatically rearrange the channel map.

In the embodiment shown in FIG. 7, the components with the same characters shown in FIG. 1 have the same function, and the description will be omitted. In the embodiment shown in FIG. 7, S301 to S310 are specific function to the embodiment shown in FIG. 7.

Operations of S301 to S310 shown in FIG. 7 will be described in detail herein under with reference to the block diagram shown in FIG. 2. If the execution history value is 0 in S201, the following sequence is the same as the sequence shown FIG. 1 with the execution history value of 0, and the description will be omitted.

The sub-microcomputer 54 checks the execution history value that indicates the number of channel setup operation in S201, and forms a map of the current registered channels in S301 if the execution history value is 1 or larger. Subsequently, the minimum channel is received in S102, and whether the current channel is the current registered channel or not is judged with reference to the map of current registered channels in S302. If the current channel is the current registered channel, the number of no reception T that has been stored previously in the channel setup operations is read out.

The number of no reception T of 0 is stored on the channel map in S310 when the channel information is registered on the channel map in S110. However, during the initial state without any operation, hexadecimal data of FF has been written as the initial value of the number of no reception.

The sequence proceeds to S304 when timeout comes in S104 or S107, and whether the current channel is the current registered channel or not is judged with reference to the current registered channel map formed in S301. If the current channel is judged to be the current registered channel in S304, the sequence proceeds to S305 in which 1 is added to the number of no reception T, and the sequence proceeds to S306. If the number of no reception T exceeds 5 in S306, the sequence proceeds to S308, and the channel information of the current channel is erased from the channel map, and then the sequence proceeds to S111. On the other hand if the number of no reception T does not exceed 5 in S306, the sequence proceeds to S307, in which the number of no reception T is stored in the channel map, and then the sequence proceeds to S111. If NO result is obtained in S304, the sequence proceeds to S111.

If the current physical channel is judged to be the maximum channel in S111, 1 is added to the execution history value in S205. Subsequently, the current registered channel map is cleared in S309 and the sequence proceeds to the end.

FIG. 8 is an exemplary conceptual diagram of a channel map formed in the flash memory 52 in the channel setup operation shown in FIG. 7 for an ATSC terrestrial broadcast receiver shown in FIG. 2.

In the example shown in FIG. 8, physical channels 2, 6, 12, 14, and 61 are registered and other physical channels are not registered. The no reception history of 5 is marked for the physical channel 2 because the physical channel 2 missed reception continuously 5 times in the channel setup operation.

When the physical channel 2 cannot be received in the next channel setup operation, all the data of the physical channel 2 is erased according to the processing of S308 shown in FIG. 7. Meanwhile, hyphen marks shown in FIG. 8 show no data, but hexadecimal FF are written actually. When the physical channel is received in the next channel setup operation, 0 is reset to T according to the processing of S310 shown in FIG. 7.

In the present embodiment, existence of the broadcast signal is judged over all the channels that have been set previously only when the execution history value is 1 or larger by use of the execution history information, and the number of continuous judgment of no broadcast signal reception of the channel that has been registered on the channel map is stored in the memory means as the number of no reception. When the number of no reception stored in the memory means reaches a predetermined number or larger, the channel is erased from the channel map. However, the present embodiment may be carried out in another way as described herein under. Existence of the channel information that is registered because the broadcast signal exists on the channel map is judged in the channel setup operation, and the judgment information of the judgment result is stored in the memory means. If the judgment information is judged to exist, the number of continuous judgment of no broadcast signal reception of the channel that has been registered on the channel map is stored in the memory means as the number of no reception. When the number of no reception stored in the memory means reaches a predetermined number or larger, the channel is erased from the channel map.

In detail, the judgment information for judging the existence of the registered channel information that indicates the existence of the broadcast signal on the channel map is stored in the flash memory 52 in S205 shown in FIG. 7, and the judgment information is read out from the flash memory 52 in S201 in the next channel setup. If the judgment information indicates the existence of the registered channel information that indicates the existence of the broadcast signal, the sequence proceeds to S301.

In the above, the present invention is described exemplarily for a terrestrial broadcast television receiver, but the present invention is by no means limited to this case. As a matter of course, the present invention may be applied also to an analogue broadcast television receiver. Furthermore, it is apparent that the present invention may be applied to receivers such as tuner and set top box having no image display.

The present invention provides a receiver that is convenient for users.

We claim:

1. A device for channel set-up comprising:
    a receiver which performs a first scan to receive a broadcast signal;
    a detector which tunes a channel that is receivable by the receiver and judges whether a broadcast signal is included in the channel or not;
    a memory which stores information of existence of a broadcast signal in the tuned channel based on the judgment by the detector; and
    a channel setup which carries out channel setup operation in which the detector performs a second scan of a plurality of channels in the broadcast frequency band, and the detector and the memory are controlled to thereby store existence information of a plurality of channel broadcast signals in the broadcast frequency band in the memory;
    wherein the channel setup skips channels having broadcast signals the existence of which is stored in the memory during scanning in the channel setup operation.

2. The device as claimed in claim 1, comprising a channel up/down tuner which tunes selectively channels having broadcast signals the existence of which is stored in the memory when the channel is tuned up/down sequentially.

3. The device as claimed in claim 1, wherein existence of a broadcast signal is judged based on detection of a horizontal sync signal included in an image signal if the broadcast signal is an analogue broadcast signal.

4. The device as claimed in claim 1, wherein existence of a broadcast signal is judged based on acquisition of program information data included in the digital broadcast signal if the broadcast signal is a digital broadcast signal.

5. The device as claimed in claim 1, wherein the channel setupper stores the number of channel setup operation.

6. The device as claimed in claim 5, wherein the channel setupper carries out automatically channel setup operation periodically with a predetermined cycle time if the stored number of channel setup operation is 1 or larger.

7. The device as claimed in claim 5, comprising an initializer to initialize the number of channel setup operation stored in the memory.

8. The device as claimed in claim 5, wherein the detector judges with variable timeout time based on the number of channel setup operation.

9. The device as claimed in claim 8, wherein the variable timeout time of the detector varies depending on the time that is required to detect a horizontal sync signal included in an image signal for the analogue broadcast.

10. The device as claimed in claim 8, wherein the variable timeout time of the detector varies depending on the time that is required to analyze broadcast program information data for the digital broadcast.

11. The device as claimed in claim 1, wherein the memory stores a channel map that specifies the number of physical channels and logical channels in which a broadcast signal exists if the broadcast signal is a digital broadcast signal.

12. The device as claimed in claim 11, comprising: an OSD generator which synthesizes the channel map information stored in the memory into a display signal; and a display which displays the display signal synthesized by the OSD generator.

13. The device as claimed in claim 1, comprising a standby system that brings the receiver into a standby state for energy saving when a power source is turned off, and wherein the channel setup operation is carried out during the standby state.

14. The device as claimed in claim 1, comprising a current registered channel detector which judges whether a broadcast signal is included or not in channels having broadcast signals the existence of which is stored in the memory, and wherein when the current registered channel detector judges that the broadcast signal is not included in the channels, the existence information of the broadcast signal in the channels stored in the memory is varied.

15. The device as claimed in claim 14, wherein the current registered channel detector judges that a broadcast signal does not exist in the channels if the broadcast signal is not received repeatedly a plurality of times.

16. A channel setup method for setting up channels to be tuned in channel up/down tuning comprising:

receiving a broadcast signal;

scanning a plurality of channels sequentially, and storing the information of the channel if the scanned channels include a broadcast signal; and scanning a plurality of channels with skipping those channels previously stored based on the fact that the channels include the broadcast signal, and storing the information of the channel if the scanned channels include a broadcast signal.

17. A channel setup method as claimed in claim 16, wherein the channels scanned sequentially cover all the channels having frequencies included in the broadcast frequency band.

18. A channel setup method as claimed in claim 16, further comprising:

forming a channel map that indicates existence of the broadcast signal of the plural channels based on the information stored, and displaying the channel map formed in displaying the channel map.

\* \* \* \* \*